United States Patent
Yang et al.

(10) Patent No.: US 7,573,568 B2
(45) Date of Patent: Aug. 11, 2009

(54) METHOD AND APPARATUS FOR DETECTING A PHOTOLITHOGRAPHY PROCESSING ERROR, AND METHOD AND APPARATUS FOR MONITORING A PHOTOLITHOGRAPHY PROCESS

(75) Inventors: Yu-Sin Yang, Seoul (KR); Chung-Sam Jun, Suwon-si (KR); Sang-Mun Chon, Yongin-si (KR); Sun-Yong Choi, Sungnam-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 972 days.

(21) Appl. No.: 10/909,238

(22) Filed: Jul. 30, 2004

(65) Prior Publication Data
US 2005/0026054 A1 Feb. 3, 2005

(30) Foreign Application Priority Data
Jul. 31, 2003 (KR) ...................... 10-2003-0053055

(51) Int. Cl.
*G01N 21/00* (2006.01)
(52) U.S. Cl. ................. 356/237.2; 356/237.5
(58) Field of Classification Search ............. 356/237.2, 356/237.5
See application file for complete search history.

(56) References Cited

U.S. PATENT DOCUMENTS

| 5,363,171 | A | | 11/1994 | Mack |
| 5,409,538 | A | * | 4/1995 | Nakayama et al. .......... 118/688 |
| 5,563,702 | A | * | 10/1996 | Emery et al. ................. 356/73 |
| 5,737,072 | A | * | 4/1998 | Emery et al. ................. 356/73 |
| 5,747,201 | A | * | 5/1998 | Nakayama et al. ........... 430/30 |
| 5,930,217 | A | * | 7/1999 | Kayanuma ............... 369/59.25 |
| 6,605,394 | B2 | * | 8/2003 | Montgomery et al. .......... 430/5 |
| 7,064,846 | B1 | * | 6/2006 | Amblard et al. ............ 356/636 |
| 7,372,582 | B2 | * | 5/2008 | Negishi et al. ............. 356/625 |
| 2006/0141795 | A1 | * | 6/2006 | Negishi et al. ............. 438/706 |

FOREIGN PATENT DOCUMENTS

| JP | 2002-190446 | 7/2002 |
| KR | 99 0082951 A | 11/1999 |
| KR | 01 0060121 A | 7/2001 |
| KR | 1020030022719 | 3/2003 |

* cited by examiner

*Primary Examiner*—Roy Punnoose
(74) *Attorney, Agent, or Firm*—F. Chau & Associates, LLC (57) ABSTRACT

An apparatus for monitoring a photolithography process includes a measurer and a data processor. The measurer measures an optical characteristic of a substrate. The data processor determines defectiveness of the substrate based on the optical the measurer.

16 Claims, 13 Drawing Sheets

BELOW 0.25

0.25~0.26

0.26~0.27

0.27~0.28

ABOVE 0.28

FIG. 4B

BELOW 0.13

0.13~0.16

0.16~0.19

0.19~0.22

ABOVE 0.22

METHOD AND APPARATUS FOR DETECTING A PHOTOLITHOGRAPHY PROCESSING ERROR, AND METHOD AND APPARATUS FOR MONITORING A PHOTOLITHOGRAPHY PROCESS

CROSS-REFERENCE TO RELATED APPLICATION

This application claims priority to Korean Patent Application No. 2003-53055, filed on Jul. 31, 2003, in the Korean Intellectual Property Office, the disclosure of which is herein incorporated by reference in its entirety.

BACKGROUND

1. Technical Field

The present disclosure relates to a method and an apparatus for detecting a photolithography processing error; more particularly, a method and an apparatus for detecting a photolithography processing error in advance of a photolithography process.

2. Discussion of Related Art

Generally, a semiconductor device is manufactured by a series of processes such as a process of forming a thin film, a diffusion process, an ion implantation process, a photolithography process and an etching process. For example, a thin film is formed on a substrate in the process of forming a thin film. Impurities are implanted into a surface of the substrate in the ion implantation process. The impurities are diffused in the substrate in the diffusion process. A photoresist layer formed on the thin film is exposed and developed in the photolithography process to form a photoresist pattern. The thin film is etched using the photoresist pattern as an etching mask in the etching process.

As a semiconductor device becomes more highly integrated, the dimensions of the photoresist pattern are reduced, and equipment capable of forming minute photoresist patterns is needed.

A method of forming a minute photoresist pattern is disclosed in U.S. Pat. No. 5,363,171. In the method, when a photoresist pattern is formed on a substrate using a photo mask and a photoresist layer, a reflectivity of the photoresist layer is measured in-situ. Korean Patent Laid Open Publication No. 2000-051492 discloses a reflectivity measurement member, which measures a reflectivity of a wafer. A controller controls an exposure time of the wafer according to the reflectivity of the wafer measured by the reflectivity measurement member. The exposure time varies in accordance with the reflectivity of the wafer to form a photoresist pattern having a desired critical dimension.

In forming a photoresist pattern, it is preferred that the pattern is formed on a substrate in the photolithography process. Generally, the photolithography process is performed using an optical characteristic of a photoresist layer. A portion of the photoresist layer exposed to light has different properties from another portion of the photoresist layer not exposed to light. Accordingly, when the photoresist layer is exposed to light, the photoresist layer can be partially removed to form a photoresist pattern. To block light from passing through the photoresist layer, an anti-reflective layer is typically formed beneath the photoresist layer. The photolithography process varies according to a material characteristic of an underlying layer. When the light partially passes through the anti-reflective layer, the photoresist pattern may not have a desired configuration. As a result, the underlying layer may not have a desired critical dimension.

The photolithography process is monitored by measuring the critical dimension of the underlying layer on the substrate using a scanning electron microscope (SEM) or by inspecting a surface of the substrate. Generally, SEMs have a high magnification and is used for accurately measuring the critical dimensions. However, it is timing consuming to scan the entire surface of the substrate using the SEM because many measurement points on the surface of the substrate are required.

If a defect generated in the photolithography process may be detected in a detection process performed after the photolithography process, repetition of the photolithography process can be avoided.

SUMMARY OF THE INVENTION

Exemplary embodiments of the present invention generally include an apparatus for monitoring a photolithography process. The apparatus comprises: a measurer for measuring an optical characteristic of a substrate; and a data processor for determining defectiveness of the substrate based on the optical characteristic measured by the measurer.

In an exemplary embodiment of the present invention, an apparatus for monitoring a photolithography process comprises: a first measurer for measuring an optical characteristic of a substrate; a second measurer for measuring an optical characteristic of a photoresist pattern formed on the substrate; and a data processor for determining defectiveness of the substrate using the optical characteristic of the substrate and a defect of the photoresist pattern using the optical characteristic of the photoresist pattern.

The measurer measures a reflectivity of the substrate wherein the reflectivity is a reflectivity of an anti-reflective layer formed on the substrate. Preferably, the measurer comprises: an emitter for irradiating a light onto the substrate; a detector for detecting a light reflected from the substrate; and a calculator for calculating the reflectivity of the substrate using a ratio between energy of the irradiated light and energy of the detected light. The apparatus for monitoring a photolithography process comprises a display for displaying the optical characteristic of the substrate.

Preferably, the light irradiated from the emitter has a wavelength identical to the wavelength of a light used in an actual photolithography process. The wavelength of the irradiated light is about 248 nm, about 193 nm or about 157 nm.

In another exemplary embodiment of the present invention, a method for detecting a photolithography processing error comprises: forming an underlying layer on a substrate: forming an anti-reflective layer on the underlying layer; measuring a reflectivity of the substrate by irradiating light onto the anti-reflective layer; and determining defectiveness in a photolithography process using the reflectivity of the substrate.

In yet another exemplary embodiment of the present invention, a method for monitoring a photolithography process comprises: forming an underlying layer on a substrate; forming an anti-reflective layer on the underlying layer; measuring a first reflectivity of the substrate by irradiating first light onto the anti-reflective layer; determining defectiveness of the substrate using the first reflectivity of the substrate; forming a photoresist pattern on the anti-reflective layer; measuring a second reflectivity of the photoresist pattern by irradiating second light onto the photoresist pattern; and determining defectiveness of the photoresist pattern using the second reflectivity of the photoresist pattern.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention.

DESCRIPTION OF THE PREFERRED EMBODIMENTS

Exemplary embodiments of the present invention now will be described more fully hereinafter with reference to the accompanying drawings. This disclosure may, however, be embodied in many different forms and should not be construed as limited to the exemplary embodiments set forth herein; rather, these exemplary embodiments are provided so that this disclosure will be thorough and complete, and will fully convey the scope of the invention to those skilled in the art.

Figure 1:
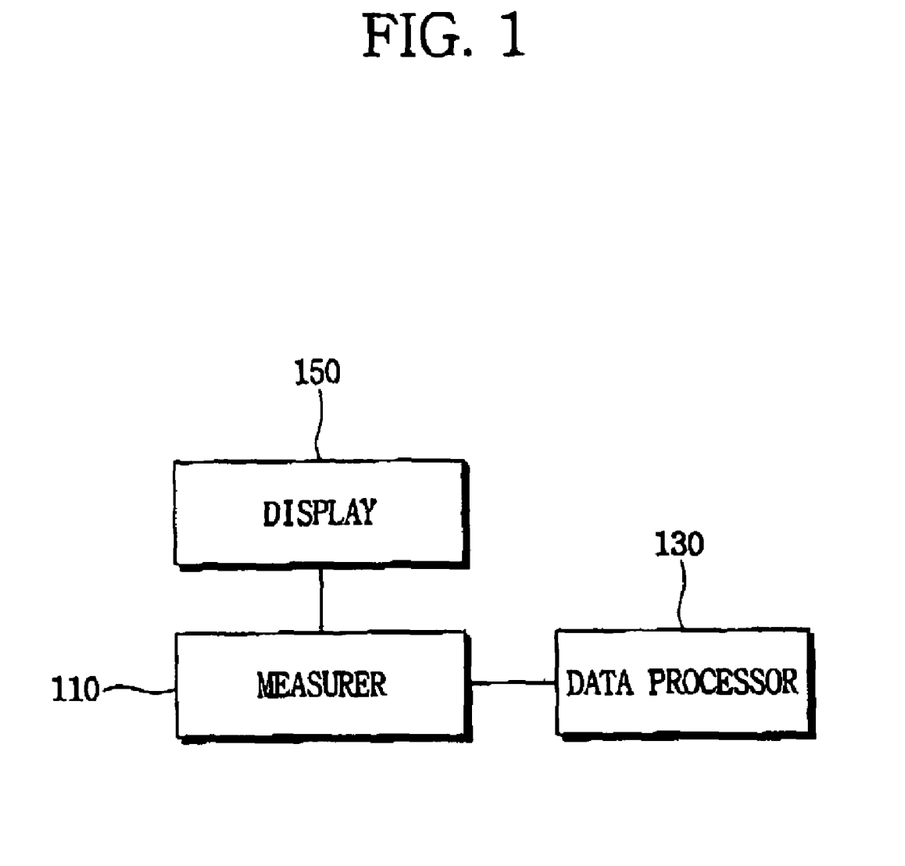
FIG. 1 is a block diagram illustrating an apparatus for detecting a photolithography processing error in advance of a photolithography process according to one exemplary embodiment of the present invention.

FIG. 1 is a block diagram illustrating an apparatus for detecting a photolithography processing error according to one exemplary embodiment of the present invention.

Referring to FIG. 1, an apparatus for detecting a photolithography processing error determines abnormal conditions of a substrate W (shown in FIG. 2) before performing a photolithography process. The apparatus for detecting a photolithography processing error includes a measurer (110), a data processor (130), and a display (150). The measurer 110 measures a reflectivity of an anti-reflective layer (not shown) formed on the substrate W. The data processor 130 determines the abnormality of the substrate W using the reflectivity of the anti-reflective layer measured by the measurer 110. The display 150 displays the reflectivity of the anti-reflective layer.

Figure 2:
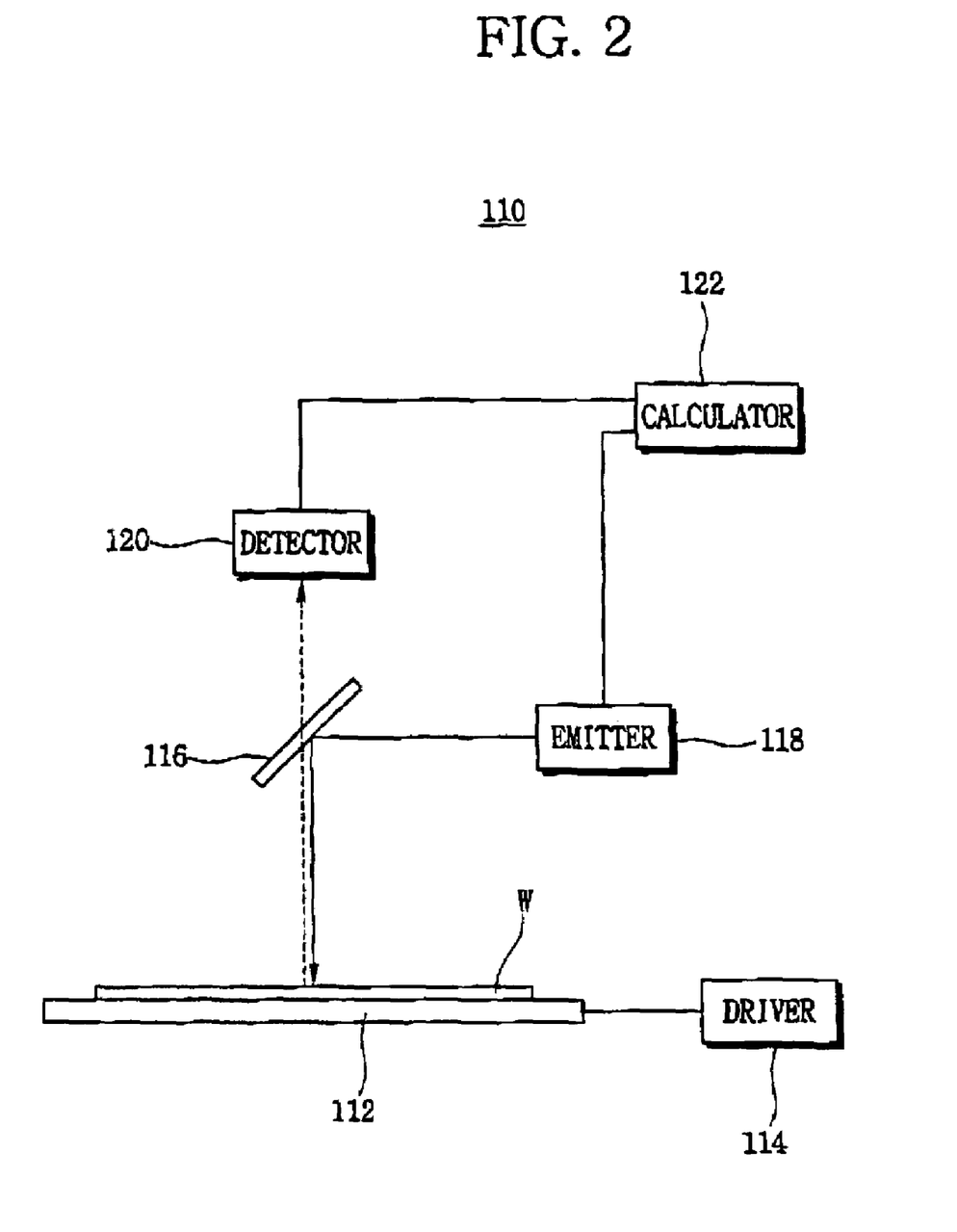
FIG. 2 is a block diagram illustrating a measurer for measuring a reflectivity of a substrate.

FIG. 2 is a block diagram illustrating the measurer shown in FIG. 1 for measuring the reflectivity of the anti-reflective layer on the substrate W.

Referring to FIG. 2, the measurer 110 includes an emitter 118, a detector 120, and a calculator 122.

The emitter 118 irradiates light onto the anti-reflective layer (not shown) formed on the substrate W for measuring the reflectivity of the anti-reflective layer. The substrate W is disposed on a stage 112 having a flat plate (not shown). The measurer 110 measures the reflectivity of the anti-reflective layer when a photoresist layer (not shown) formed on the anti-reflective layer is exposed. The light emitted from the emitter 118 is identical to light which is to be used in the actual photolithography process in which the photoresist layer is patterned to form a photoresist pattern. For example, the light includes a KrF laser having a wavelength of about 248 nm, an ArF laser having a wavelength of about 193 nm or $F_2$ laser having a wavelength of about 157 nm.

The light emitted from the emitter 118 is reflected from a mirror 116 disposed over the stage 112. The reflected light is irradiated onto the anti-reflective layer of the substrate W disposed on the stage 112.

The detector 120 detects a light reflected from the anti-reflective layer. The calculator 122 is connected to the emitter 118 and the detector 120, respectively. The calculator 122 calculates the reflectivity of the anti-reflective layer using a ratio between energy of the detected light and energy of the irradiated light.

A driver 114 is connected to the stage 112. The driver 114 can move in an X-axis direction and in a Y-axis direction, where the Y-axis is perpendicular to the X-axis, for measuring the reflectivity of the entire substrate W.

Figure 3A:
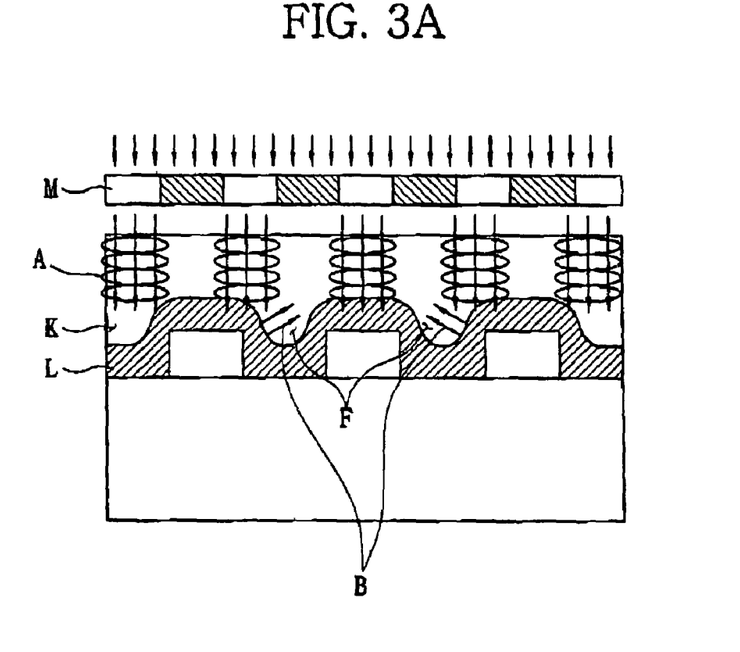
FIGS. 3A and 3B are cross-sectional views illustrating defective layers formed on a substrate.
Figure 3B:
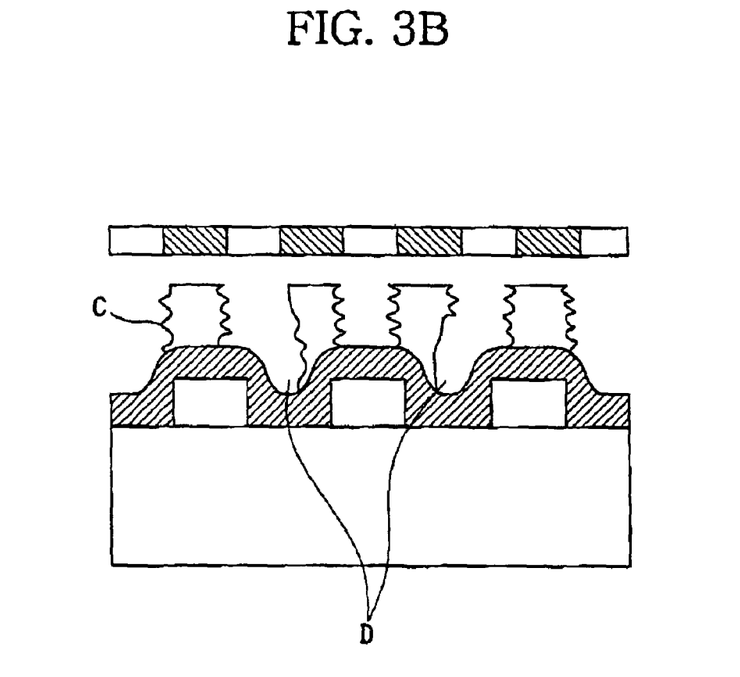

FIGS. 3A and 3B are cross-sectional views illustrating defective layers formed on a substrate. FIG. 3A shows a process for exposing the photoresist layer using a photo mask. FIG. 3B shows a process for developing the exposed photoresist layer.

Referring to FIGS. 3A and 3B, light reflected from an underlying layer L formed under the photoresist layer K may have two effects. A first effect is an occurrence of a standing wave A. A second effect is a notching effect as indicated by diagonal arrows in FIG. 3A. Generally, the standing wave A is generated due to an interference between incident light irradiated onto the photoresist layer and light reflected from the underlying layer L. The standing wave A may produce a wave shape C on a sidewall of the photoresist layer K.

The notching effect produces an undesired portion D of the photoresist layer exposed due to diffused light B reflected from the underlying layer. The diffused reflection of the light B may occur at a stepped portion F. Thus, an indented shape D may be formed on the sidewall of the photoresist layer due to the notching effect.

To prevent the occurrence of the standing wave A and the notching effect B, the anti-reflective layer (not shown) can be formed on the substrate W prior to the photolithography process to reduce the amount of the light reflected from the underlying layer L toward the photoresist layer K. Although the anti-reflective layer is formed on the substrate W, process conditions of the photolithography process can still be affected by the reflectivity relative to a wavelength of light used in the photolithography process. Accordingly, the defective condition of the photolithography process may be determined using the reflectivity of the substrate W having the anti-reflective layer.

The anti-reflective layer minimizes the amount of the reflected light and reduces influence of the underlying layer L. A portion of the substrate W having a relatively high reflectivity may be determined to be defective. In other words, the high reflectivity may indicate that the photolithography process is defectively carried out on the portion of the substrate W.

Figure 4A:
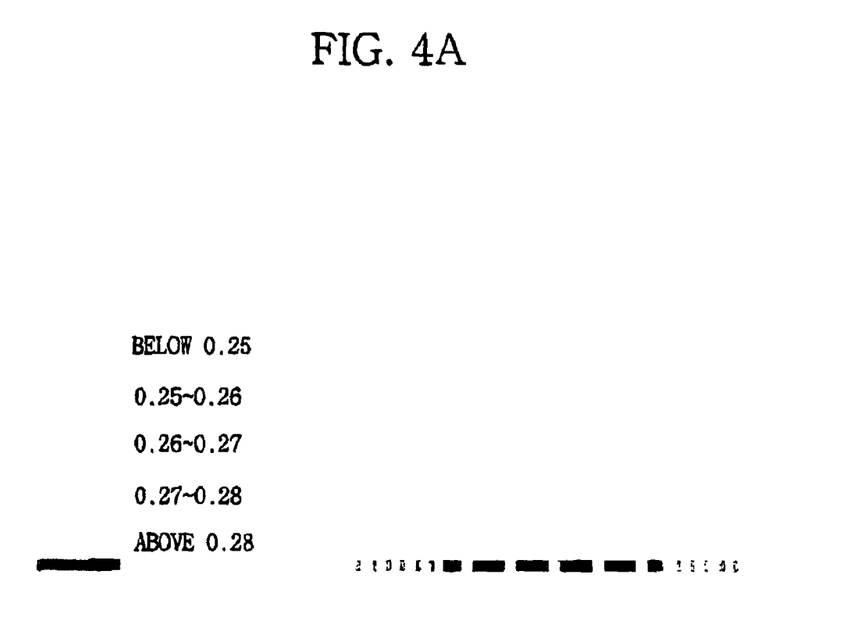
FIGS. 4A and 4B are maps illustrating reflectivity of anti-reflective layers formed on substrates.
Figure 4B:
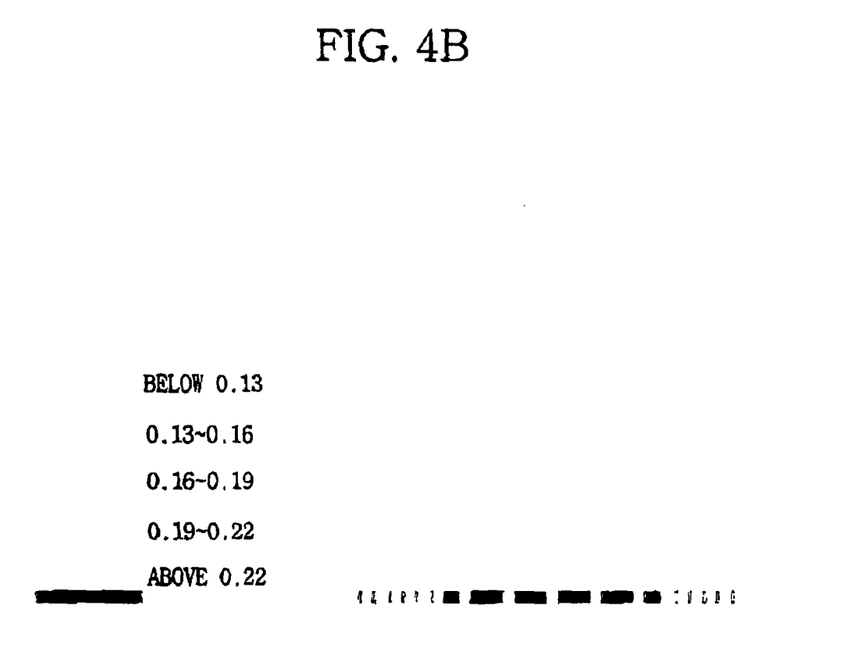

FIGS. 4A and 4B are maps illustrating reflectivity of anti-reflective layers formed on substrates.

Referring to FIGS. 4A and 4B, the substrate W used in FIG. 4A had a greater reflectivity than that of the substrate W in FIG. 4B. A left lower portion of the substrate W in FIG. 4A had a greater reflectivity than other portions of the substrate W in FIG. 4A. As a result, the substrate W in FIG. 4A may be determined to be defective compared to same portions of FIG. 4B. The left lower portion of the substrate W in FIG. 4A might be determined to be defective compared to other portions of the substrate W in FIG. 4A. That is, the anti-reflective layer (not shown) positioned on the left lower portion of the substrate W may not perform properly.

Figure 5A:
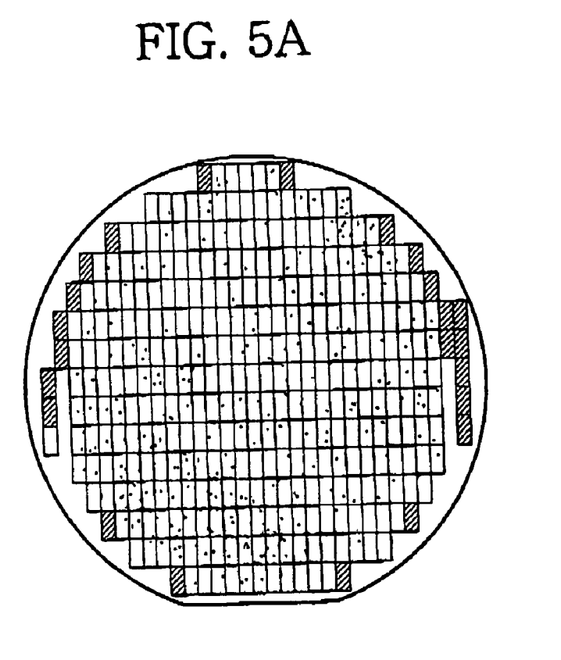
FIGS. 5A and 5B are plan views illustrating the substrates having defects in FIGS. 4A and 4B.
Figure 5B:
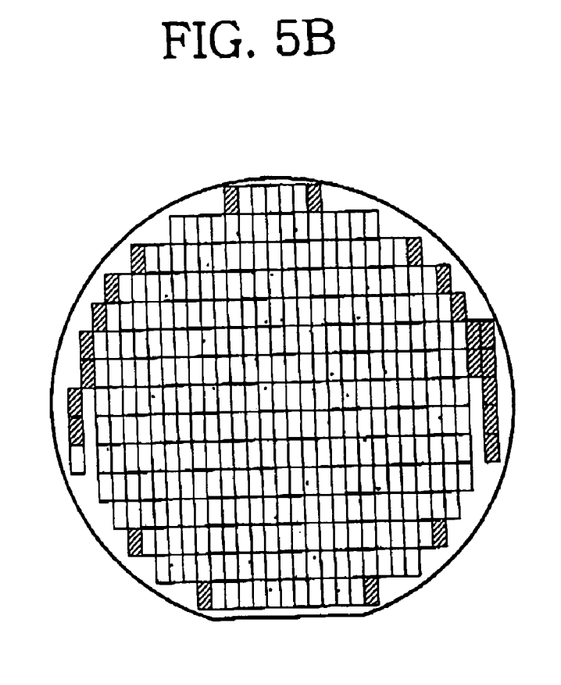
Figure 6A:
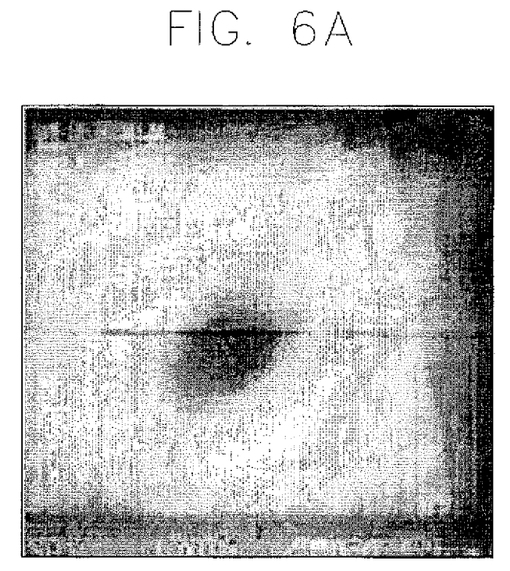
FIGS. 6A and 6B are pictures illustrating collapsed photoresist patterns due to the defects of the substrates.
Figure 6B:
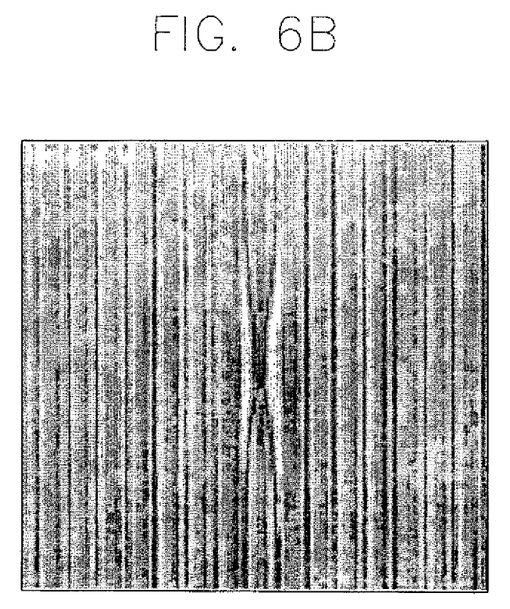

FIGS. 5A and 5B are plan views illustrating the substrates having defects in FIGS. 4A and 4B. As described above, the left lower portion of the substrate W in FIG. 4A had greater reflectivity than other portions of the same substrate W. Thus, the left lower portion of the substrate in FIG. 5A had more defects than other portions of the substrate in FIG. 5A. Many collapsed photoresist patterns as shown in FIG. 6A and 6B were found in the left lower portion of the substrate in FIG. 5A compared to other portions of the substrate in FIG. 5A. However, the collapsed photoresist pattern was not found in the substrate W in FIG. 5B.

When the reflectivity of the anti-reflective layer is low, the photolithography process performed normally.

In one exemplary embodiment of the invention, the defectiveness of the photolithography process may be determined using a thickness of the underlying layer when the anti-reflective layer is not formed on the substrate W.

Figure 7:
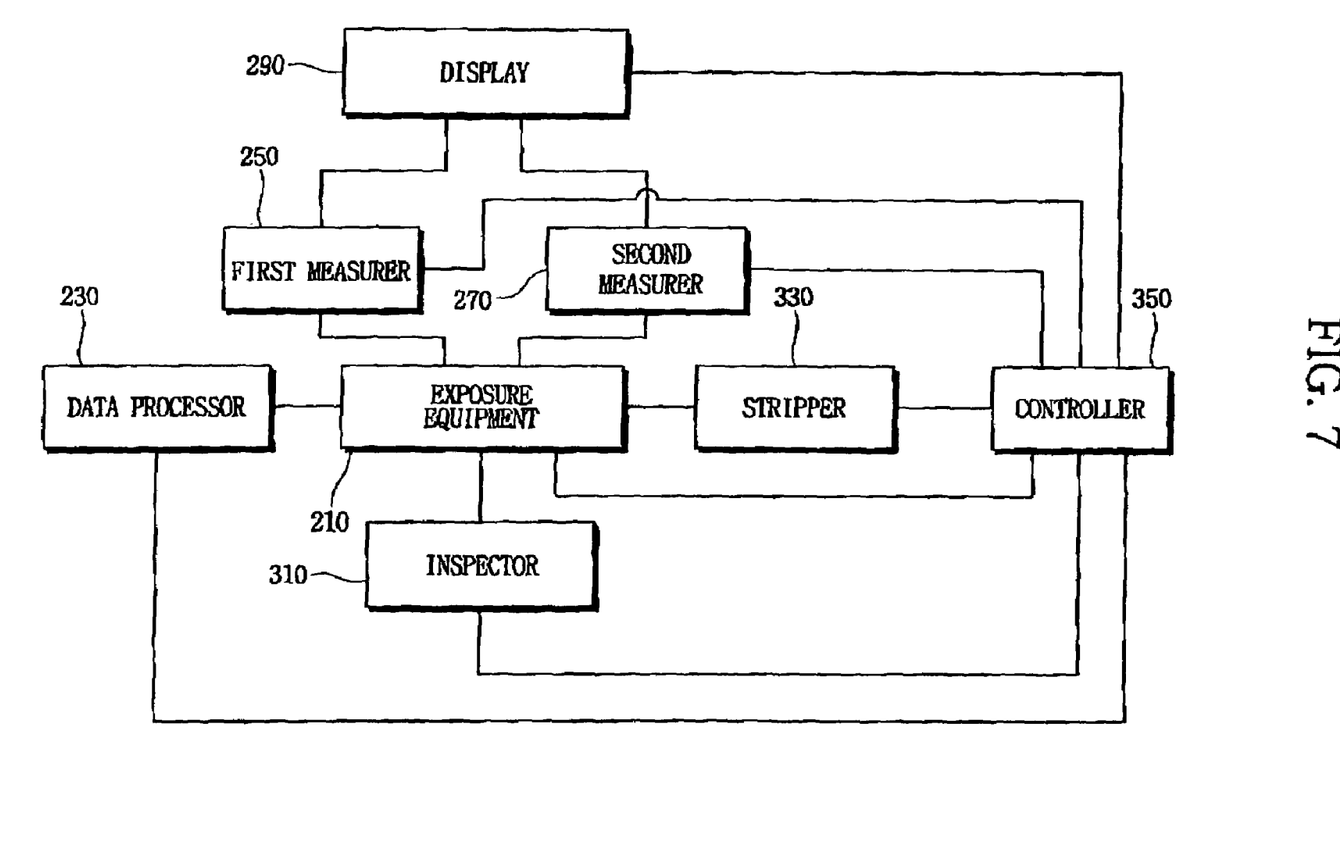
FIG. 7 is a block diagram illustrating an apparatus for monitoring a photolithography process in accordance with another exemplary embodiment of the present invention.

FIG. 7 is a block diagram illustrating an apparatus for monitoring a photolithography process in accordance with another exemplary embodiment of the present invention.

Referring to FIG. 7, an apparatus monitors a photolithography process in which a pattern of a photo mask is transcribed onto a substrate W using an exposure equipment 210. The apparatus for monitoring a photolithography process includes a first measurer 250 for measuring a first reflectivity of an anti-reflective layer formed on the substrate W. A second measurer 270 measures a second reflectivity of a photoresist pattern formed on the substrate W. A data processor 230 determines defectiveness of the anti-reflective layer and the photoresist layer using the first and the second reflectivity. An inspector 310 inspects the substrate W when the photoresist pattern is determined to be defective by the data processor 230. A stripper 330 removes the photoresist pattern and a part of the anti-reflective layer positioned under the photoresist pattern when the photoresist pattern is determined to be defective by the data processor 230. The anti-reflective layer is determined to be defective by the data processor 230. A display 290 displays the first and the second reflectivity. A controller 350 controls operations of the first and the second measurers 250 and 270, the data processor 230, the stripper 330, and the display 290.

The exposure equipment 210 includes a photoresist treating unit (not shown), an exposing unit, an etching unit (not shown), a photoresist removing unit (not shown), and a cleaning unit (not shown).

Photoresist is coated on the substrate W by the photoresist treating unit to form the photoresist layer. The photoresist is spin-coated on the substrate W, thereby having a uniform thickness by a centrifugal force. The photoresist treating unit also bakes the photoresist layer using, for example, a hot plate, a conveyor furnace or an infrared ray tool. The photoresist treating unit dips the substrate having the photoresist layer into a developing solution or sprays the developing solution on the photoresist layer after the photoresist layer is exposed in the exposing unit in the exposure equipment 210.

Light passes through a mask having a pattern in the exposing unit to transcribe the pattern onto the photoresist layer. The light may include, for example, a KrF laser having a wavelength of about 248 nm, an ArF laser having a wavelength of about 193 nm or a $F_2$ laser having a wavelength of about 157 nm.

The exposed photoresist layer can partially be removed using, for example, a chemical material or a reacting gas in the etching unit to form the photoresist pattern. Dry etching or wet etching can be used for the exposed photoresist layer.

The photoresist removing unit in the exposure equipment 210 removes the photoresist remaining on the substrate W. Removing the remaining photoresist may be categorized into two types: a wet type using a resist removing solution and a dry type using oxygen plasma. The dry type photoresist removing unit is referred to as an asher because the photoresist is oxidized and forms ash. The cleaning unit in the exposure unit 210 cleans the substrate W.

Figure 8:
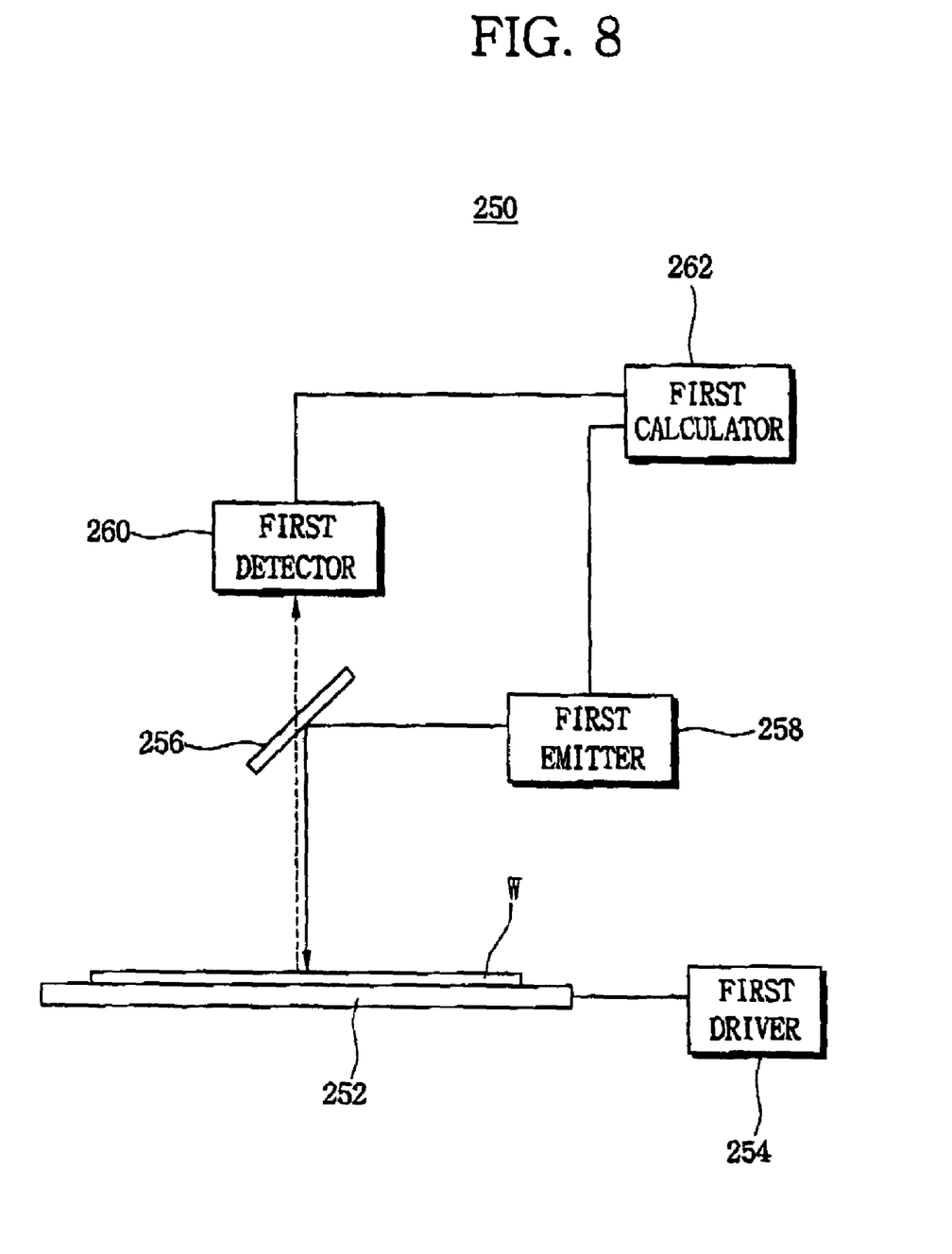
FIG. 8 is a block diagram illustrating a first measurer for measuring a reflectivity of a substrate in FIG. 7.

FIG. 8 is a block diagram illustrating a first measurer for measuring a reflectivity of a substrate in FIG. 7.

Referring to FIG. 8, the first measurer 250 includes elements identical to those of the measurer 110 of FIG. 2. The first measurer 250 includes a first emitter 258, a first detector 260, and a first calculator 262.

The first emitter 258 irradiates light onto the anti-reflective layer (not shown) formed on the substrate W for measuring the first reflectivity of the anti-reflective layer. The substrate W is disposed on a stage 252 having a flat plate (not shown). The first measurer 250 measures the reflectivity of the anti-reflective layer when a photoresist layer formed on the anti-reflective layer is exposed. Accordingly, the light emitted from the first emitter 258 is identical to light used in the actual photolithography process in which the photoresist layer is patterned to form a photoresist pattern. For example, the first light includes a KrF laser having a wavelength of about 248 nm, an ArF laser having a wavelength of about 193 nm or $F_2$ laser having a wavelength of about 157 nm.

The first light is reflected from a first mirror 256 disposed over the stage 252. The reflected first light is irradiated onto the anti-reflective layer of the substrate W disposed on the stage 252.

The first detector 260 detects the light reflected from the anti-reflective layer. The first calculator 262 is connected to the first emitter 258 and the first detector 260, respectively. The first calculator 262 calculates the reflectivity of the anti-reflective layer using a ratio between energy of the detected light and energy of the irradiated light.

A first driver 254 is connected to the stage 252. The first driver 254 can move in an X-axis direction and in a Y-axis direction, where the Y-axis is perpendicular to the X-axis, for measuring the reflectivity of the entire substrate W.

Figure 9:
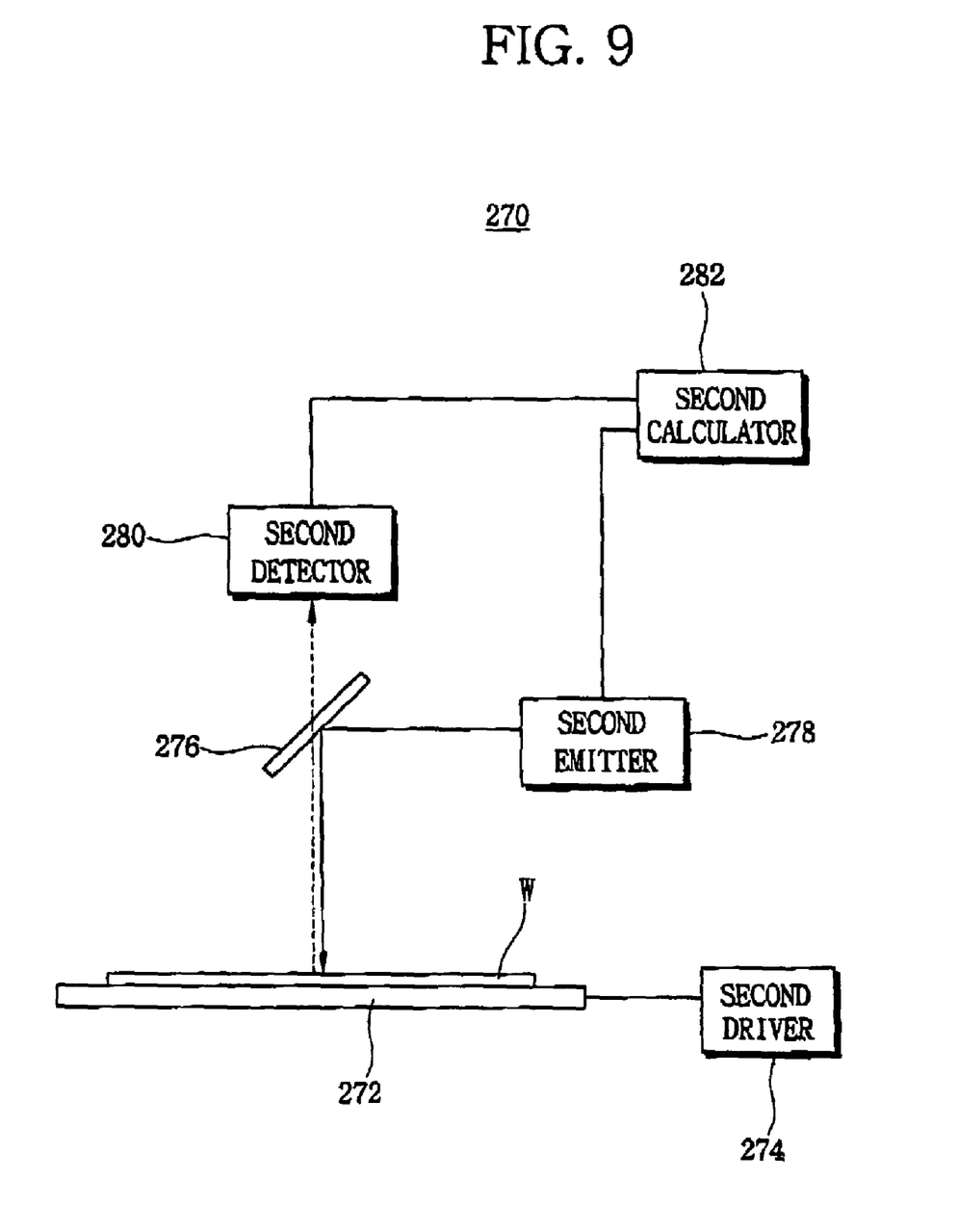
FIG. 9 is a block diagram illustrating a second measurer for measuring a reflectivity of a substrate in FIG. 7.

FIG. 9 is a block diagram illustrating a second measurer for measuring a reflectivity of a substrate in FIG. 7.

Referring to FIG. 9, the second measurer 270 includes elements similar to those of the first measurer 250 of FIG. 8. The second measurer 270 includes a second emitter 278, a second detector 280, and a second calculator 282.

The second emitter 278 irradiates second light onto the photoresist pattern (not shown) formed on the substrate W for measuring the second reflectivity of the photoresist pattern. The light emitted from the second emitter 278 preferably includes light with little effect on the photoresist pattern. For example, the second light has a wavelength of about 250 nm to about 800 nm.

The second light is reflected from a second mirror 276 configured over the stage 272. The reflected light is irradiated onto the photoresist pattern of the substrate W disposed on the stage 272.

The second detector 280 detects the second light reflected from the photoresist pattern (not shown). The second calculator 282 is connected to the second emitter 278 and the second detector 280, respectively. The second calculator 282 calculates the reflectivity of the photoresist pattern using a ratio between energy of the detected light and energy of the irradiated light.

A second driver 274 is connected to the stage 272. The second driver 274 can move in an X-axis direction and in a Y-axis direction, where Y-axis is perpendicular to the X-axis, for measuring the reflectivity of the entire substrate W.

The display 290 (see FIG. 7) displays the first reflectivity of the anti-reflective layer and the second reflectivity of the photoresist pattern.

The data processor 230 (see FIG. 7) determines the defectiveness of the substrate W using the first reflectivity of the anti-reflective layer. The data processor 230 also determines the defectiveness of line width of the photoresist pattern using the second reflectivity of the photoresist pattern, essentially as described above.

Hereinafter, determining the defectiveness of the photoresist pattern using the second reflectivity of the photoresist pattern is described.

Figure 10A:
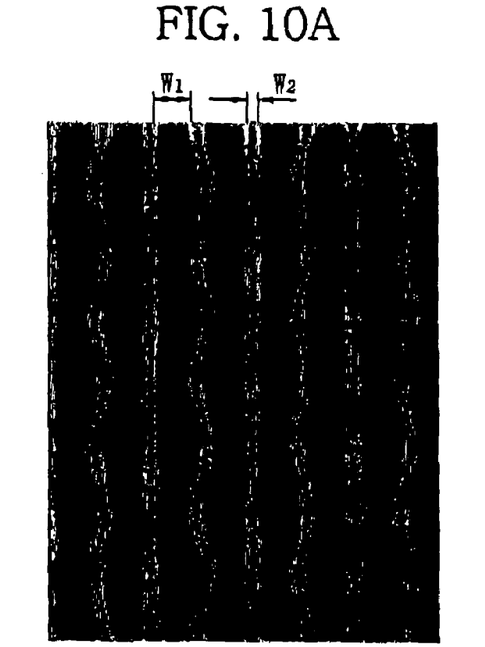
FIGS. 10A and 10B are pictures illustrating photoresist patterns formed on substrates.
Figure 10B:
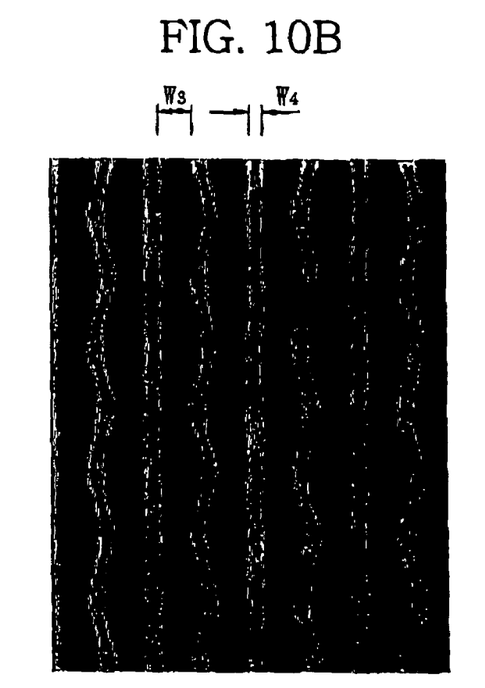

FIGS. 10A and 10B are pictures illustrating photoresist patterns formed on substrates.

FIGS. 10A and 10B are pictures taken using scanning electron microscope (SEM). As shown in FIG. 1A, when a width w1 of a pattern is wide, an interval w2 between the patterns is narrow. Thus, a portion of the photoresist pattern positioned in the interval w2 exhibits a relatively higher reflectivity compared to other portions of the photoresist pattern. Meanwhile, as shown in FIG. 10B, when a width w3 of a pattern is narrow, an interval w4 between the patterns is wide. Thus, a portion of the photoresist pattern positioned in the interval w4 exhibits a relatively lower reflectivity compared to other portions of the photoresist pattern.

Accordingly, the line width of the photoresist pattern formed on the substrate W may be detected by measuring the second reflectivity of the photoresist pattern after the photolithography process is performed.

Figure 11:
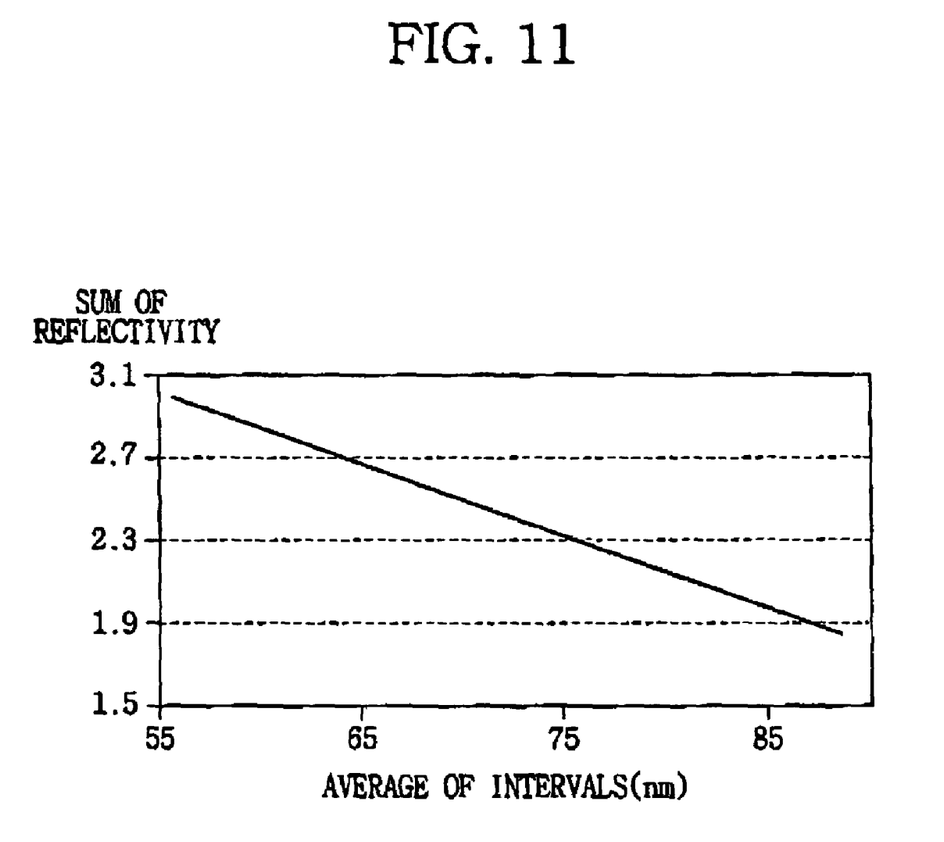
FIG. 11 is a graph showing a relationship between reflectivity of the photoresist pattern and a line width of the photoresist pattern.

FIG. 11 is a graph showing a relationship between reflectivity of the photoresist pattern and a line width of the photoresist pattern.

Light having a wavelength of about 250 nm to about 800 nm was irradiated onto the photoresist pattern. The reflectivity of the photoresist pattern was then measured. The line width of the photoresist pattern was measured using an SEM. The reflectivity of the photoresist pattern increased because the width of the pattern increased as the interval between the patterns reduced. Therefore, a map representing the line width of the photoresist pattern could be predicted through measuring the reflectivity of the photoresist pattern after performing the photolithography process. The defectiveness of the photoresist pattern could be determined using the map.

Referring again to FIG. 7, the inspector 310 inspects the substrate W to detect a defective line width of the photoresist pattern. The inspector 310 is a high-magnification inspector such as an SEM. When the photoresist pattern is determined to be defective I from measuring the second reflectivity of the photoresist pattern, the inspector 310 continues the inspection for the substrate W. The inspector 310 is selectively used to reduce the large amount of time for inspecting the entire substrate W, such as an SEM.

The stripper 330 removes the photoresist pattern and/or the anti-reflective layer on the substrate W. The defectiveness of substrate W can be determined by the data processor 230 using the first reflectivity of the anti-reflective layer measured by the first measurer 250. Then, the stripper 330 removes the anti-reflective layer for forming a new anti-reflective layer. The defects of line width of the photoresist pattern is determined by the data processor 230 using the second reflectivity of the photoresist pattern measured by the second measurer 270. The defective line width can be detected by the inspector 310. Then, the stripper 330 removes the photoresist pattern and a portion of the anti-reflective layer positioned under the photoresist pattern.

The controller 350 controls the photolithography process using data outputted from the first and the second measurers 250 and 270, the data processor 230, the display 290, the stripper 330, and the inspector 310. The controller 350 sends a signal to the first measurer 250 to measure the first reflectivity of the anti-reflective layer before performing the photolithography process. When the photolithography process is determined to be defective by the data processor 230 using the first reflectivity of the anti-reflective layer, the controller 350 sends a signal to the stripper 330 to remove the anti-reflective layer.

When the photoresist pattern is formed on the substrate W, the controller 350 sends a signal to the second measurer 270 to measure the second reflectivity of the photoresist pattern. When the photoresist pattern is determined to be defective by the data processor 230 using the second reflectivity of the photoresist pattern, the controller 350 sends a signal to the inspector 310 to inspect the photoresist pattern. When the defective photoresist pattern is detected by the inspector 310, the controller 350 sends a signal to the stripper 330 to remove the photoresist pattern and the anti-reflective layer.

Figure 12:
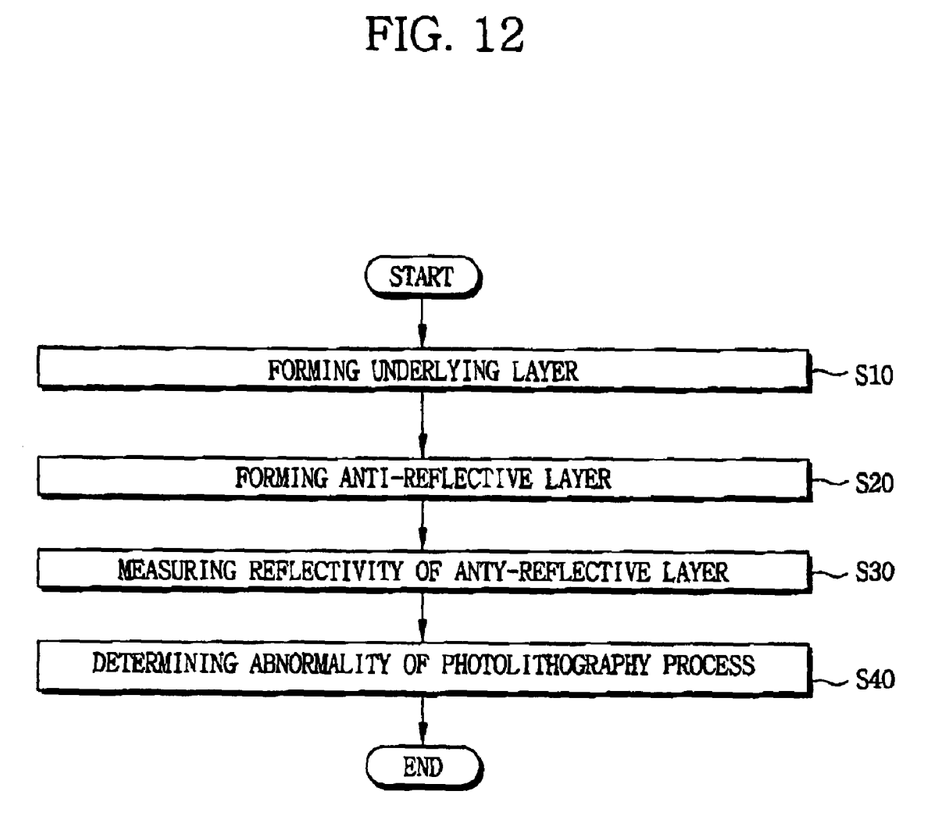
FIG. 12 is a flow chart illustrating a method for detecting a photolithography processing error in advance of a photolithography process using the apparatus in FIG. 1 according to one exemplary embodiment of the present invention.

FIG. 12 is a flow chart illustrating a method for detecting a photolithography processing error using the apparatus in FIG. 2 in accordance with one exemplary embodiment of the present invention.

Referring to FIG. 12, in step S10, an underlying layer is formed on a substrate W. Light used in the photolithography process partially passes through the underlying layer. The underlying layer can be a single underlying layer or a multipleunderlying layer.

In step S20, an anti-reflective layer is formed on the substrate W to prevent light from being reflected against the underlying layer.

In step S30, the light emitted from the emitter 118 is irradiated onto the anti-reflective layer. The light is identical to a light used in an actual photolithography process, for example a KrF laser, an ArF laser or $F_2$ laser. The detector 120 shown in FIG. 2 detects light reflected from the anti-reflective layer. The calculator 122 measures the reflectivity of the anti-reflective layer using a difference between energy of the irradiated light and energy of the detected light. The display 150 shows the reflectivity of the anti-reflective layer.

In step S40, the data processor 130 determines the defectiveness of the photolithography process using the reflectivity of the anti-reflective layer.

Accordingly, the defectiveness of the photolithography process can be detected in advance of the photolithography process so that the defective photolithography process may not continue. As a result, an unnecessary repetition of the photolithography process may be prevented.

Figure 13:
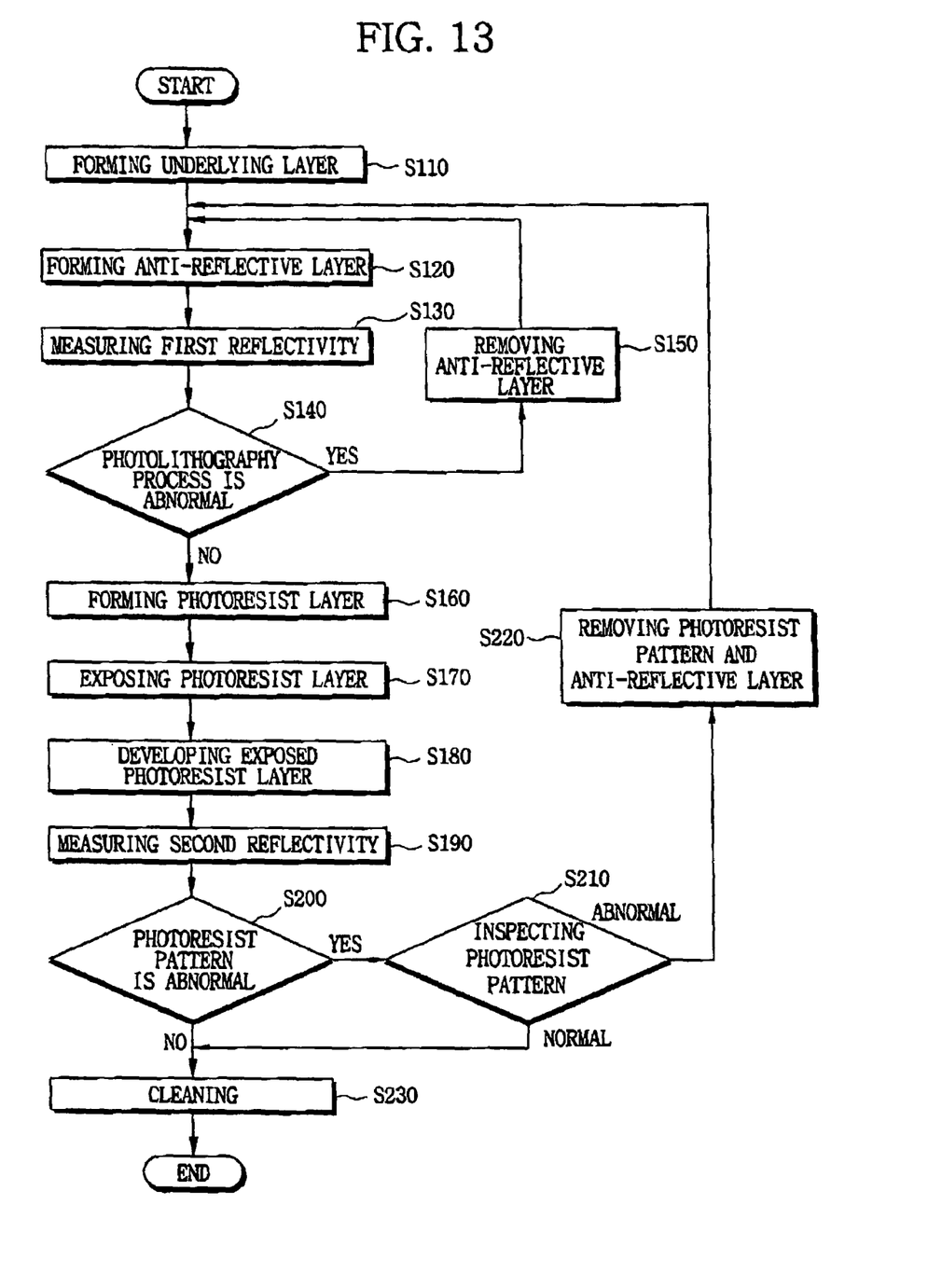
FIG. 13 is a flow chart illustrating a method for monitoring a photolithography process using the apparatus in FIG. 7 in accordance with another exemplary embodiment of the present invention.

FIG. 13 is a flow chart illustrating a method for monitoring a photolithography process using the apparatus in FIG. 7 in accordance with another exemplary embodiment of the present invention.

Referring to FIG. 13, in step S10, an underlying layer is formed on a substrate W. Light used in the photolithography process partially passes through the underlying layer. The underlying layer is either a single underlying layer or a multiple underlying layer.

In step S120, an anti-reflective layer is formed on the substrate W to prevent light from being reflected against the underlying layer.

In step S130, light emitted from the first emitter 258 shown in FIG. 8 is irradiated onto the anti-reflective layer. The light is identical to the light used in an actual photolithography process such as a KrF laser, an ArF laser or $F_2$ laser. The first detector 260 detects light reflected from the anti-reflective layer. The first calculator 262 measures the first reflectivity of the anti-reflective layer using a difference between energy of the irradiated light and energy of the detected light. The display 290 shows the first reflectivity of the anti-reflective layer.

In step S140, the data processor 230 determines the defectiveness of the photolithography process using the first reflectivity of the anti-reflective layer. When the photolithography process is determined not to be defective, a photolithography process is subsequently performed.

When the photolithography process is determined to be defective, in step S150, the stripper 330 removes the anti-reflective layer. The exposure equipment 210 forms a new anti-reflective layer on the substrate W.

In step S160, a photoresist layer is formed on the anti-reflective layer.

In step S170, the photoresist layer is exposed to light such as a KrF laser, an ArF laser or $F_2$ laser using a mask having a pattern.

In step S180, the exposed photoresist layer is developed using a developing solution to form a photoresist pattern.

In step S190, light emitted from the second emitter 278 is irradiated onto the photoresist pattern. The second detector 280 detects light reflected from the photoresist pattern. The second calculator 282 measures the second reflectivity of the photoresist pattern using a difference between energy of the irradiated light and energy of the detected light. The display 290 shows the second reflectivity of the anti-reflective layer.

In step S200, the data processor 230 determines the defectiveness of the photoresist pattern using the second reflectivity of the photoresist pattern. When the photoresist pattern is determined not to be defective, a photolithography process is subsequently performed.

When the photoresist pattern is determined to be defective, in step S210, the inspector 310 inspects the line width of the photoresist pattern using a more accurate device such as the SEM. When the photoresist pattern is determined not to be defective, a photolithography process is subsequently performed.

When the defectiveness of the photoresist pattern is recognized through the inspector 310, the stripper 330 removes the photoresist pattern and the anti-reflective layer in step S220. The exposure equipment 210 forms a new anti-reflective layer on the substrate W. Then, the photolithography processing unit 210 forms a new photoresist layer on the new anti-reflective layer.

In step S230, the new photoresist layer is selectively exposed and developed to form a new photoresist pattern. Then, the new photoresist layer remaining on the anti-reflective layer is removed and the substrate W is cleaned.

According to an exemplary embodiment of the present invention, the defectiveness of the anti-reflective layer and the photoresist pattern can be monitored in a higher speed by measuring the reflectivity of the anti-reflective layer. Therefore, the defective photolithography process may not be further performed and an unnecessary repetition of the photolithography process may be prevented. Furthermore, the defectiveness of the photoresist pattern may be determined by measuring the reflectivity of the photoresist pattern. If only when the photoresist pattern is defective, the photoresist pattern is inspected, the time for monitoring the photolithography process is reduced.

Although exemplary embodiments have been described herein with reference to the accompanying drawings, it is to be understood that the present invention is not limited to those precise embodiments, and that various other changes and modifications may be affected therein by one of ordinary skill in the related art without departing from the scope or spirit of the invention. All such changes and modifications are intended to be included within the scope of the invention as defined by the appended claims.

What is claimed is:

1. An apparatus for monitoring a photolithography process comprising: a first measurer for measuring an optical characteristic of a substrate; a second measurer for measuring an optical characteristic of a photoresist pattern formed on the substrate; and a data processor for determining defectiveness of the substrate using the optical characteristic of the substrate and defectiveness of the photoresist pattern using the optical characteristic of the photoresist pattern.

2. The apparatus of claim 1, wherein the first measurer measures a first reflectivity of an anti-reflective layer formed on the substrate.

3. The apparatus of claim 2, wherein the first measurer comprises: a first emitter for irradiating light onto the anti-reflective layer; a first detector for detecting the light reflected from the anti-reflective layer; and a first calculator for calculator the reflectivity of the anti-reflective layer using a ratio between energy of the irradiated first light and energy of the detected first light.

4. The apparatus of claim 1, wherein the second measurer measures a second reflectivity of the photoresist pattern.

5. The apparatus of claim 4, wherein the second measurer comprises: a second emitter for irradiating light onto the photoresist pattern; a second detector for detecting the light reflected from the photoresist pattern; and a second calculator for calculating the reflectivity of the photoresist pattern using a ratio between energy of the irradiated second light and energy of the detected second light.

6. The apparatus of claim 5, wherein the light has a wavelength of about 250 nm to about 800 nm.

7. The apparatus of claim 4, further comprising a high-magnification inspecting device for inspecting the substrate when the photoresist pattern is determined to be defective.

8. The apparatus of claim 1, further comprising a stripper for removing an anti-reflective layer formed on the substrate when the substrate is determined to be defective, and for removing the photoresist pattern and a portion of the anti-reflective layer formed under the photoresist pattern when the photoresist pattern is determined to be defective.

9. The apparatus of claim 1, further comprising a display unit for displaying the optical characteristics of the substrate and the photoresist pattern.

10. A method for monitoring a photolithography process comprising: forming an underlying layer on a substrate; forming an anti-reflective layer on the underlying layer; measuring a first reflectivity of the substrate by irradiating first light onto the anti-reflective layer; determining defectiveness of the substrate using the first reflectivity of the substrate; forming a photoresist pattern on the anti-reflective layer; measuring a second reflectivity of the photoresist pattern by irradiating second light onto the photoresist pattern; and determining defectiveness of the photoresist pattern using the second reflectivity of the photoresist pattern.

11. The method of claim 10, further comprising: removing the anti-reflective layer when the substrate is determined to be defective; and forming another anti-reflective layer on the substrate.

12. The method of claim 10, wherein measuring the first reflectivity comprises: irradiating the first light onto the anti-reflective layer; detecting the first light reflected from the anti-reflective layer; and calculating the first reflectivity using a ratio between energy of the irradiated first light and energy of the detected first light.

13. The method of claim 10, wherein the irradiated second light has a wavelength of about 250 nm to about 800 nm.

14. The method of claim 10, further comprising inspecting the photoresist pattern when the photoresist pattern is determined to be defective.

15. The method of claim 14, thither comprising: removing the photoresist layer and the anti-reflective layer when the photoresist layer is determined to be defective; and forming another anti-reflective layer and another photoresist layer on the substrate.

16. The method of claim 10, wherein measuring the second reflectivity comprises: irradiating the second light onto the photoresist pattern; detecting the second light reflected from the photoresist pattern; and calculating the second reflectivity of the photoresist pattern using a ratio between energy of the irradiated second light and energy of the detected second light.

* * * * *